(12) United States Patent  (10) Patent No.: US 7,760,020 B2
Groiss  (45) Date of Patent: Jul. 20, 2010

(54) AMPLIFIER DEVICE

(75) Inventor: Stefan Hermann Groiss, Villach-Landskron (AT)

(73) Assignee: Infineon Technologies AG, Neubiberg (DE)

( * ) Notice: Subject to any disclaimer, the term of this patent is extended or adjusted under 35 U.S.C. 154(b) by 10 days.

(21) Appl. No.: 12/121,965

(22) Filed: May 16, 2008

(65) Prior Publication Data
US 2009/0284316 A1   Nov. 19, 2009

(51) Int. Cl.
H03F 3/45 (2006.01)
(52) U.S. Cl. .................. 330/254; 330/278; 330/308
(58) Field of Classification Search .............. 330/59, 330/254, 278, 308
See application file for complete search history.

(56) References Cited

U.S. PATENT DOCUMENTS 7,492,222 B2 *  2/2009  Cowley et al. .......... 330/124 R
2002/0158682 A1  10/2002  Conte et al.
2004/0145799 A1 *  7/2004  Sedic ...................... 359/325

* cited by examiner

Primary Examiner—Khanh V Nguyen
(74) Attorney, Agent, or Firm—Dickstein, Shapiro, LLP.

(57) ABSTRACT

An electronic circuit arrangement is provided which comprises an input terminal configured to input an input signal to be amplified and an output terminal configured to output the amplified input signal as an output signal. A signal path is defined between the input terminal and the output terminal. An amplifier unit having an amplifier gain is provided and being configured to amplify the input signal and for generating the output signal. A variation of an operational current of the amplifier unit is configured to provide a variation of the amplifier gain. The amplifier unit is arranged within the signal path. Furthermore a gain control unit is configured to control the gain of the amplifier unit by adjusting the operational current of the amplifier unit. The gain control unit is arranged outside the signal path.

21 Claims, 4 Drawing Sheets

AMPLIFIER DEVICE

BACKGROUND

Figure 1:
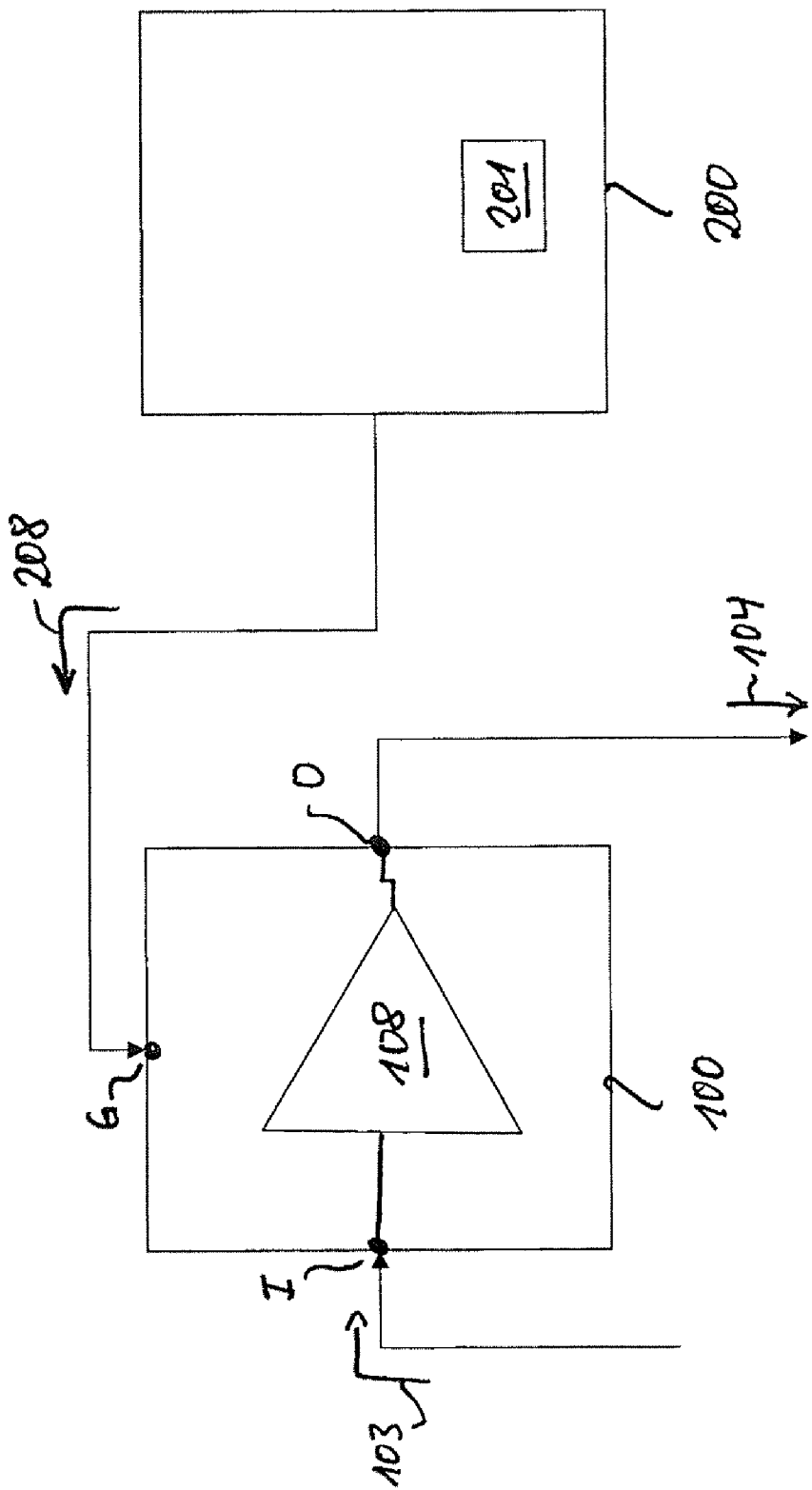

The present description generally relates to amplifier devices, and in particular relates to a transimpedance amplifier device.

In some applications amplifier units are used for amplifying a current, originating e.g. from a photodiode, in order to provide an output voltage. Such kind of amplifier units are called transimpedance amplifiers because the relation between the output signal (voltage) and the input signal (current) is defined in units of an impedance. The larger the impedance, the larger in principle is the gain of the transimpedance amplifier.

A major disadvantage of such an amplifier configuration is that parasitic capacitances are present due to a high value of the transimpedance such that a fast control loop cannot be provided.

In conventional transimpedance amplifiers the transimpedance element (e.g. an Ohmic resistor) is located in a signal path of the amplifier chain. Thus, it is not possible to realize high operational frequencies of the entire amplifier unit. High operational frequencies, however, are required in many applications where currents have to be transformed into output voltages, e.g. in the detection of light variations.

SUMMARY

According to a first aspect of the present description an electronic circuit arrangement is provided which includes an input terminal configured to input an input signal to be amplified, an output terminal configured to output the amplified input signal as an output signal, wherein a signal path is defined between the input terminal and the output terminal, an amplifier unit having an amplifier gain and being configured to amplify the input signal and to provide the output signal, wherein the amplifier unit is arranged within the signal path, and a gain control unit configured to control the gain of the amplifier unit, wherein the gain control unit is arranged outside the signal path.

According to a further aspect of the present invention an amplifier array is provided which includes at least two amplifier units each having an input terminal configured to input an input signal to be amplified, an output terminal configured to output the amplified input signal as an output signal, wherein a signal path is defined between the input terminal and the output terminal, and an amplifier gain configured to amplify the input signal and to provide the output signal, wherein the amplifier unit is arranged within the signal path, and a gain control unit configured to control the amplifier gain of the at least two amplifier units, wherein the gain control unit is arranged outside all signal paths.

According to a yet a further aspect of the present invention a method for controlling an amplifier gain of at least one amplifier unit is provided, including the steps of inputting an input signal to be amplified via an input terminal of the amplifier unit, amplifying the input signal and providing an output signal by the at least one amplifier unit having an amplifier gain, outputting the amplified input signal via an output terminal, wherein the at least one amplifier unit is arranged within a signal path defined between the input terminal and the output terminal, and controlling the gain of the at least one amplifier unit using a gain control unit which is arranged outside the signal path.

DRAWINGS

Embodiments of the present invention are depicted in the drawings and are detailed in the description which follows.

Figure 2:
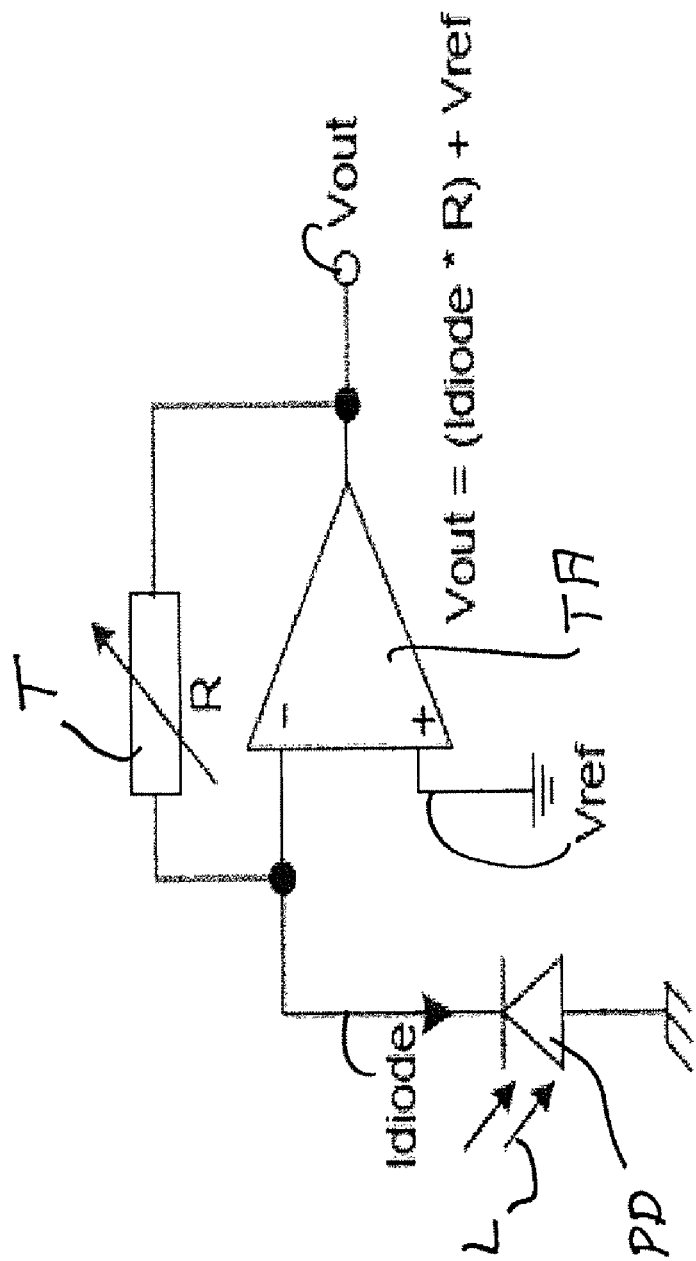
Figure 3:
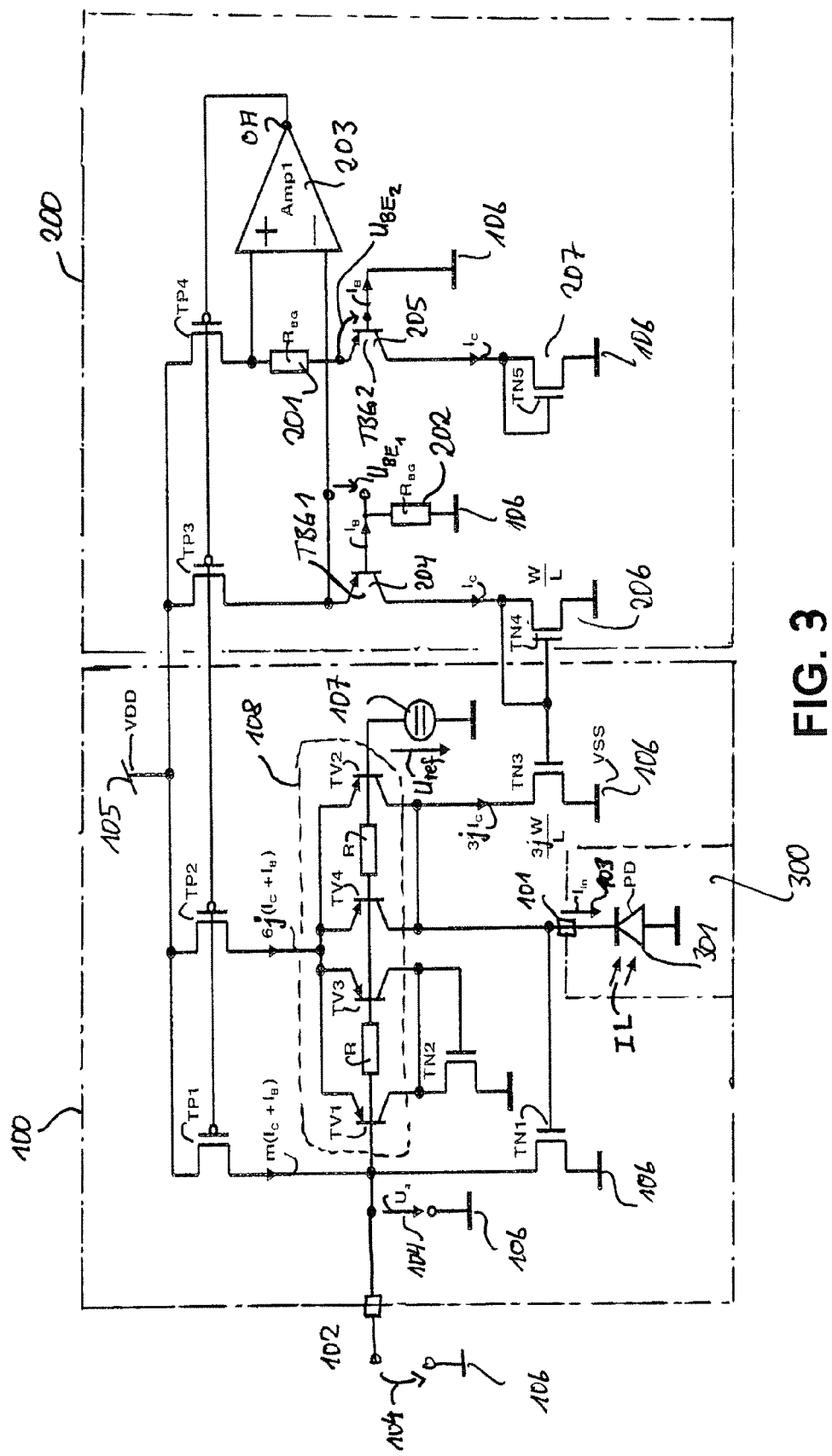
Figure 4:
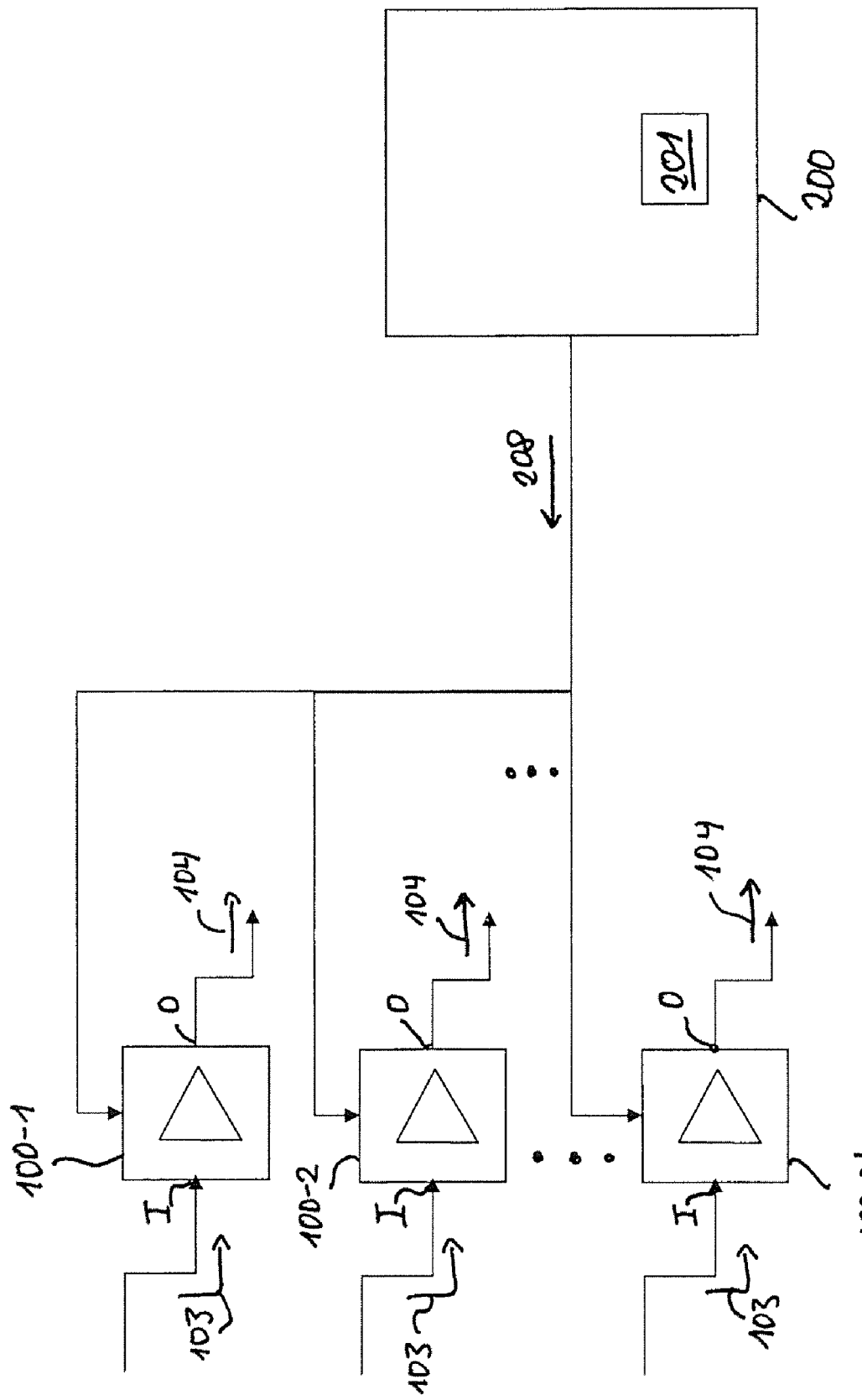

In the drawings:

FIG. 1 is a block diagram of an electronic circuit arrangement having separate amplifier and gain control units, according to a typical embodiment of the present invention;

FIG. 2 further elucidates the operation of an amplifier unit;

FIG. 3 shows a detailed circuit diagram of an electronic circuit arrangement for providing a transimpedance amplification according to the typical embodiment of the present invention; and FIG. 4 is a block diagram of an amplifier array including a plurality of amplifier units which are controlled by a single gain control unit, according to a further typical embodiment of the present invention.

In the Figures, same reference numerals denote the same or similar parts or steps.

DETAILED DESCRIPTION

Reference will now be made in detail to the various exemplary embodiments, one or more examples of which are illustrated in the Figures. Thereby, features illustrated or described as part of one embodiment can be used on or in conjunction with other embodiments to yield yet a further embodiment. It is intended that the present description includes such modifications and variations.

A number of embodiments will be explained below. In this case, identical structural features are identified by identical reference symbols in the Figures. The structures shown in the Figures are not depicted true to scale but rather serve only for the better understanding of the embodiments.

FIG. 1 is a block diagram showing the interaction of an amplifier unit 100 and a gain control unit 200. The amplifier unit 100 includes an amplifier core 108, an input terminal I and an output terminal O. An input signal 103 is fed to the amplifier core 108 via the input terminal I, wherein the amplified input signal 103 is provided as an output signal 104 at the output terminal O.

In case the input signal 103 is an input current, i.e. from a photodiode, and the output signal 104 is an output voltage, the amplifier unit 100 performs a transimpedance transfer which is dependent on a transimpedance of the amplifier unit. The gain control unit 200, which includes a gain control element 201, provides a gain control signal 208 which is set to a gain control input G of the amplifier unit 100.

It is noted that the gain control element 201 determines the transimpedance of the amplifier unit such that the gain control element 201 carries out the function of a transimpedance element. The transfer function of the amplifier unit 100 and the amplifier core 108, respectively, is determined by the gain control unit 200. The transfer function can be expressed as:

$$k = U\text{out}/I\text{in}$$

wherein Uout is the output voltage and Iin is the input current. As this transfer function is the ratio of a voltage to a current, the unit of the transfer function is in Ohm.

FIG. 2 further elucidates the operation of an amplifier unit which is based on the transimpedance effect. The principle arrangement of a transimpedance amplifier TA includes a transimpedance T provided as a resistor R which is variable.

The output voltage Vout depends on the input current Idiode according to the following formula:

$$Vout=(Idiode \cdot R)+Vref$$

wherein Vref is a reference voltage applied to a non-inverting input terminal of the transimpedance amplifier TA.

Using the configuration shown in FIG. 2, incident light L is transformed into a diode current Idiode by means of a photodiode element PD. Then, the photodiode current Idiode is transformed into the output voltage Vout as a function of the transimpedance element T having a preset value of R.

According to a typical embodiment, the transimpedance is provided by the gain control unit 200 such that the transimpedance itself is not contained within a signal path from the input terminal I to the output terminal O of the amplifier unit 100.

FIG. 3 is a detailed circuit diagram of a typical embodiment of the transimpedance amplifier. As shown in FIG. 3, the circuit arrangement essentially consists of three circuit blocks, i.e. the amplifier unit 100, the gain control unit 200 and a sensor device 300. In the typical embodiment shown in FIG. 3, the sensor device 300 consists of a photodiode 301, which provides an input signal 103 in dependence of an incident light beam IL.

A supply voltage 105 (VDD) is provided with respect to ground potential 106 (VSS). Four transistors TP1, TP2, TP3 and TP4 control respective currents from the supply voltage terminal 105 to the respective circuit parts. The source (emitter) of each of the control transistors TP1-TP4 is connected to the supply voltage 105, wherein the drain (collector) of each of these transistors is connected to the respective circuit.

The gates (bases) of the transistors TP1-TP4 are connected to each other and are connected to an output terminal OA of an operational amplifier 203 included in the gain control unit 200.

In order to derive a transfer function (transimpedance) of the circuit arrangement shown in FIG. 3, at first the function of the bandgap reference contained in the gain control unit 200 will be described. Two transistors TBG1 and TBG2 control input currents into the operational amplifier 203. An emitter area of the transistor TBG2 to an emitter area of the transistor TBG1 corresponds to a ratio of n. The emitter of the transistor TBG1 is connected to the transistor TP3 and an inverting input (−) of the operational amplifier 203, wherein the emitter of the transistor TBG2 is connected to a gain control element 201 (an Ohmic resistor in this case, RBG), the other end of which is connected to the transistor TP4 and the non-inverting input (+) of the operational amplifier 203.

A reference element 202, which in the present embodiment corresponds to the gain control element 201, is connected between the base of the transistor TBG1 and ground potential 106. The Ohmic resistance value of the reference element 202 ($R_{BG}$) corresponds to the Ohmic resistance value of the gain control element 201 ($R_{BG}$). Both transistors TP3 and TP4 of the gain control unit 200 are loaded by identical currents, i.e. by the currents $I_C+I_B$. A potential difference between the base-emitter voltages of the transistors TBG1 and TBG2 thus have to be equalized by a potential difference which is provided at the connection terminals of the gain control element 201 ($R_{BG}$).

The input signal 103 which is provided as an input current $I_{in}$ is dependent on the incident light intensity IL incident onto the photodiode 301 (PD) and flows as a collector current of transistors TV2 and TV4 provided in the amplifier core 108 of the amplifier unit 100. It is advantageous if the collector currents of the transistors TV2 and TV4 are transferred into an appropriate output signal 104, i.e. into an output voltage $U_a$. As shown in FIG. 3 (right side), a current which is the sum of the collector current $I_C$ of the transistor TBG2 (second control transistor 205) and the base current $I_B$ of the transistor TBG2, flows through the gain control element 201 ($R_{BG}$).

A potential difference between the non-inverting input (+) of the operational amplifier 203 (Amp1) and the ground potential 106 is represented by the sum of two partial voltages, i.e. a base-emitter voltage $U_{BE2}$ of the second control transistor 205 (TBG2) and the product of the sum of the base current $I_B$ and the collector current $I_C$ of the second control transistor 205 and the resistance value of the gain control element 201 ($R_{BG}$).

The potential difference between the inverting input (−) of the operational amplifier 203 is the sum of the base-emitter voltage $U_{BE1}$ of the transistor TBG1 (first control transistor 204) and a potential drop occurring at the reference element 202. The base current $I_B$ of the first control transistor 204 flows through the reference element 202 causing a respective voltage drop of $I_B \cdot R_{BG}$. The operational amplifier 203 (Amp1) adjusts the difference between its inverting input (−) and its non-inverting input (+) to be zero, such that the following equation holds:

$$U_{BE1}+I_B \cdot R_{BG}=U_{BE2}+(I_B+I_C) \cdot R_{BG} \tag{1}$$

As can be seen from equation (1), the base current $I_B$ of the transistors TBG1 and TBG2 is eliminated. The voltage difference between the base-emitter voltages of the transistors TBG1 and TBG2 is thus:

$$U_{BE1}-U_{BE2}=I_C \cdot R_{BG} \tag{2}$$

A collector current of any transistor may be evaluated as a function of the saturation current $I_S$ and the exponential function of the ratio of the respective base-emitter voltage and the thermal voltage $U_T$. The thermal voltage $U_T$ is given by $U_T=kT/e$, wherein k corresponds to the Boltzmann constant, T corresponds to the absolute temperature and e corresponds to the elementary charge.

The emitter current of the transistor TBG1 thus is given by the following equation:

$$I_{C1}=I_S \exp(U_{BE1}/U_T) \tag{3a}$$

wherein the collector current of the transistor TBG2 is given by the following equation:

$$I_{C2}=n \cdot I_S \exp(U_{BE2}/U_T) \tag{3b}$$

The factor n in equation (3b) results from the different emitter areas of the transistors TBG2 and TBG1. As mentioned above the emitter area of TBG2 is n times as large as the emitter area of TBG1. Due to the control method using the transistors TP3 and TP4, the collector currents $I_{C1}$ according to equation (3a) above and $I_{C2}$ according to equation (3b) above have to be identical such that the following relations hold:

$$I_{C1}=I_{C2}=I_C \text{ and } U_T=kT/e \tag{4}$$

By combining equations (3a), (3b), (4) and (2) and by applying a logarithmic calculus, the following equation (5) is obtained:

$$\ln(n) = \frac{U_{BE_2} - U_{BE_2}}{U_T} = I_C \cdot R_{BG} \cdot e/(kT) \tag{5}$$

Thus, the collector current $I_C$ of the transistor $T_{BG1}$ and the transistor $T_{BG2}$, respectively, is given by $$I_C = kT\ln(n)/(eR_{BG}) \qquad (6)$$

Currents which are generated by means of the transistors TP3 and TP4 are mirrored into the amplifier unit 100 by means of the transistors TP1 and TP2. An emitter area of the transistor TP1 is designed to be m times the emitter area of the transistors TP3, TP4, wherein an emitter area of the transistor TP2 is designed to be 6j times the emitter area of the transistors TP3 and TP4, respectively. It is noted that j is given as a constant factor which may be adjusted by providing different emitter areas of the respective transistors. Thus, the transistor TP1 mirrors a current of $m(I_C+I_B)$ wherein the transistor TP2 mirrors a current of $6j(I_C+I_B)$.

In the following, it is assumed that the output voltage $U_a$ (output signal 104) which is provided at an output terminal 102 of the amplifier unit 100 with respect to the ground potential 106, is identical to a reference voltage $U_{ref}$ which is provided by a reference voltage source 107. In this case ($U_a = U_{ref}$), currents of $3j \times I_C$ flow via diodes TN2 and TN3, respectively. The diodes TN2 and TN3 both have a area (W/L) of 3j with respect to the area of MOS diodes TN4 and TN5 (first and second MOS-diodes 206 and 207, respectively) provided in the gain control unit 200.

It is noted here that the reference voltage $U_{ref}$ provided by the reference voltage source 107 may be adjusted in a large range. The reference voltage $U_{ref}$ may be zero. A transistor TN1 which is connected between the output terminal 102 and the ground potential 106 is scaled with respect to the diode TN4 by a factor of m, such that a current of $m(I_C+I_B)$ may flow through the transistor TN1.

A gate-source voltage of TN1 corresponds to that of the MOS diode TN4 such that, in case of $U_a = U_{ref}$, the drain-source voltage of TN3 exactly corresponds to that of the MOS-diode TN4 such that the Early-effect is completely eliminated.

For reasons of symmetry, a MOS-diode TN2 is provided corresponding to a transistor TN3 which is connected between the collector of the core transistors TV2, TV4 and ground potential 106 (VSS). The configuration of the amplifier core 108 shown in the amplifier unit 100 of FIG. 3 together with both resistors R results in an input current $I_{in}$ for an emitter area ratio of TV3 to TV1 and TV4 to TV2, respectively of a factor of 1 in the following:

$$I_{in} = 3/(2(1+1)) \cdot \frac{a}{kT} \cdot I_C \cdot j \cdot (U_a - U_{ref}) \qquad (7)$$

By combining equations (6) and (7) above, the voltage difference between the output voltage $U_a$ (output signal 104) and the reference voltage $U_{ref}$ which is provided by the reference voltage source 107 may be expressed as:

$$U_a - U_{ref} = (2(1+1))/3 jR_{BG} \cdot I_{in}/\ln(n) \neq f(T) \qquad (8)$$

From equation (8) it can be seen that the output voltage and the voltage difference between the output voltage and the reference voltage, $U_a$ and $U_{ref}$ respectively, does not depend on the temperature. Thus, the voltage difference $U_a - U_{ref}$ is represented as a constant factor TI (transimpedance) multiplied by the input signal (input current $I_{in}$ provided by the photodiode 301) as depicted in equation (9) below:

$$U_a - U_{ref} = TI \cdot I_{in} \qquad (9)$$

By comparing equations (8) and (9) above, the transimpedance resulting from the circuit arrangement illustrated with respect to FIG. 3 can be written as:

$$TI = (2(1+1))/3 jR_{BG}/\ln(n) \qquad (10)$$

It is noted that the transimpedance TI may be designated as a virtual transimpedance, because the transimpedance element is not arranged in the signal path of the amplifier unit. As can be seen from equation (10), the transimpedance does not depend on the absolute temperature T and is not provided in the dynamic path (the amplifier unit 100) of the circuit arrangement shown in FIG. 3, but in the static path (the gain control unit 200) of the circuit arrangement shown in FIG. 3 such that high operational frequencies of the amplifier unit 100 can be obtained. For a factor l=2 of the emitter areas of TV3 and TV4 with respect to TV1 and TV2, respectively, equation (10) may be rewritten as:

$$TI = 2R_{BG}/(j \cdot \ln(n)) \qquad (11)$$

As it is shown by equation (11), the voltage difference of the output voltages between $U_a$ and $U_{ref}$ is directly proportional to the input current $I_{in}$ (photodiode current, input signal 103) such that a constant transimpedance is provided. It is a specific advantage of the circuit arrangement illustrated in FIG. 3 that the effective transimpedance TI according to equations (10), (11) is constant and is not provided directly in the signal path, i.e. in a path between the input terminal 101 and the output terminal 102 of the amplifier unit 100, but in a static circuit unit, i.e. the gain control unit 200.

Thus the input current does not flow through the transimpedance, as shown in FIG. 1, but an operational point of the amplifier unit 100 is adjusted by the gain control element 201 of the gain control unit 200. A parasitic capacitance of the transimpedance TI thus cannot occur within the signal path of the amplifier unit 100 such that very high operational frequencies of the amplifier unit can be achieved. An effective transimpedance TI according to equations (10), (11) is thus provided in virtually static circuit components such as the gain control unit 200. By adjusting the ratios defined by the constants j, n and l, the value of the transimpedance can be appropriately adjusted.

As an example, n=8 is chosen such that in a circuit layout a transistor TBG1 is surrounded by eight partial transistors TBG2. Using a value of j=0.25, an effective transimpedance results in $$TI = 3.847 \cdot R_{BG}$$

Thus, the effective transimpedance is nearly four times as large as the Ohmic value of the resistance $R_{BG}$ of the gain control element 201. Advantageously, this means that less circuit space has to be provided compared to conventional transimpedance amplifier arrangements.

It is noted that the circuit arrangement shown in FIG. 3 is based on the use of NMOS transistors. The present invention, however, is not restricted to the use of NMOS transistors. It is possible to replace all NMOS transistors by PMOS transistors and vice versa. Furthermore, all NMOS transistors may be replaced by bipolar npn transistors and all PMOS transistors may be replaced by bipolar pnp transistors, such that the whole circuit is based on bipolar technology. Furthermore, all bipolar pnp transistors may replaced bipolar npn transistors.

As the gain of the entire amplifier unit is determined by the transimpedance element TI, an easy gain adjustment may be provided just by switching the gain control element 201 and the reference element 202 simultaneously to different values. Furthermore, it is possible to provide a reference element 202 with a fixed ratio with respect to an Ohmic resistance value as compared to the gain control element 201.

FIG. 4 is a block diagram of an amplifier array including a plurality of amplifier units 100-1, 100-2, . . . , 100-N which are controlled by a single gain control unit 200 via a gain control signal 208.

The amplifier units 100-1, 100-2, . . . , 100-N each have an input terminal I for inputting an input signal 103 to be amplified and an output terminal O for outputting the amplified input signal as an output signal 104. A signal path is defined between the input terminal I and the output terminal O. An amplifier gain for amplifying the input signal and for providing an output signal is adjusted, wherein a variation of an operational current of the amplifier unit provides a variation of the respective amplifier gain. All amplifier units are arranged within the respective signal paths.

As shown in FIG. 4, the gain control unit 200 for controlling the amplifier gain of the amplifier units 100-1, 100-2, . . . , 100-N is arranged outside all signal paths.

The inventive concept is applicable to other areas where a current-to-voltage conversion is required. The circuit arrangement may be adapted for sensors which provide a current, e.g. photodiodes which provide a current in dependence of an incident light intensity.

It is noted that, although the present invention has been described with respect to photodiode sensors, it is not limited to light conversion or sensor devices at all. The present invention may be employed in applications where a voltage-to-voltage conversion is required if it is possible to convert the input voltage input current, e.g. by using an input resistor or an input impedance.

The invention has been described on the basis of embodiments which are shown in the appended figures and from which further advantages and modifications emerge. However, the invention is not restricted to the embodiments described in concrete terms, but can rather be modified and varied in a suitable manner. It lies within the scope of the invention to combine individual features and combinations of features of one embodiment with features and combinations of features of another embodiment in a suitable manner in order to arrive at further embodiments according to the invention.

It will be obvious to those skilled in the art that based upon the teachings herein changes and modifications may be made without departing from the invention disclosed and its broader aspects. That is, all examples set forth herein above are intended to be exemplary and non-limiting.

The invention claimed is:

1. An electronic circuit arrangement, comprising:
   a) an input terminal configured to input an input signal to be amplified;
   b) an output terminal configured to output the amplified input signal as an output signal,
   c) wherein a signal path is defined between the input terminal and the output terminal;
   d) a transimpedance amplifier unit having an amplifier gain and being configured to amplify the input signal and to provide the output signal, wherein the transimpedance amplifier unit is arranged within the signal path; and
   e) a gain control unit configured to control the gain of the transimpedance amplifier unit, the gain control unit comprising a transimpedance element configured to control a gain ratio between the output signal and the input signal by adjusting the operational current of the transimpedance amplifier unit, wherein the gain control unit comprising the transimpedance element is arranged outside the signal path.

2. The electronic circuit arrangement in accordance with claim 1, wherein the input signal is a current.

3. The electronic circuit arrangement in accordance with claim 1, wherein the output signal is a voltage potential difference.

4. The electronic circuit arrangement in accordance with claim 1, wherein the gain control unit comprises a bandgap reference circuit.

5. The electronic circuit arrangement in accordance with claim 1, wherein a variation of an operational current of the transimpedance amplifier unit provides a variation of the amplifier gain, and the gain control unit configured to control the gain of the transimpedance amplifier unit by adjusting the operational current of the transimpedance amplifier unit.

6. The electronic circuit arrangement in accordance with claim 1, wherein the operational current of the transimpedance amplifier unit is determined by a ratio of transistor emitter areas or transistor width of the transimpedance amplifier unit to a ratio of transistor emitter areas or transistor width of the gain control unit.

7. The electronic circuit arrangement in accordance with claim 1, wherein the gain control unit comprises at least a first control transistor and a second control transistor configured to control first and second control currents, respectively, which are mirrored into the transimpedance amplifier unit.

8. The electronic circuit arrangement in accordance with claim 7, wherein a ratio of emitter areas of the first control transistor to the second control transistor is n, wherein n determines a transimpedance value of the gain control unit.

9. The electronic circuit arrangement in accordance with claim 7, wherein a ratio transistor width the first control transistor to the second control transistor is n, where n determines a transimpedance value of the gain control unit.

10. An amplifier array, comprising:
   a) at least two transimpedance amplifier units, each comprising:
      a1) an input terminal configured to input an input signal to be amplified;
      a2) an output terminal configured to output the amplified input signal as an output signal,
      a3) wherein a signal path is defined between the input terminal and the output terminal; and
      a4) an amplifier gain configured to amplify the input signal and to provide the output signal, wherein the transimpedance amplifier units are arranged within the signal path;
   and
   b) a gain control unit configured to control the amplifier gain of the at least two transimpedance amplifier units, the gain control unit comprising a transimpedance element configured to control a gain ratio between the output signal and the input signal by adjusting the operational current of the at least two transimpedance amplifier units, wherein the gain control unit comprising the transimpedance element is arranged outside the signal path.

11. The amplifier array in accordance with claim 10, wherein the operational currents of the at least two transimpedance amplifier units are adjusted simultaneously.

12. The amplifier array in accordance with claim 10, wherein at least one input signal is a current.

13. The amplifier array in accordance with claim 10, wherein at least one output signal is a voltage potential difference.

14. The amplifier array in accordance with claim 10, wherein the gain control unit comprises a bandgap reference circuit.

15. The amplifier array in accordance with claim 10, wherein a variation of an operational current of the at least two transimpedance amplifier units provides a variation of the amplifier gain, and the gain control unit configured to control the gain of the at least two transimpedance amplifier units by adjusting the operational current of the at least two transimpedance amplifier units.

16. The amplifier array in accordance with claim 10, wherein the operational currents of the at least two transimpedance amplifier units are determined by a ratio of transistor emitter areas or transistor width of the at least two transimpedance amplifier units to a ratio of transistor emitter areas or transistor width of the gain control unit.

17. The amplifier array in accordance with claim 10, wherein the gain control unit comprises at least a first control transistor and a second control transistor configured to control first and second control currents, respectively, which are mirrored into the at least two transimpedance amplifier units.

18. The amplifier array in accordance with claim 17, wherein a ratio of emitter areas of the first control transistor to the second control transistor is n, wherein n determines a transimpedance value of the gain control unit.

19. The amplifier array in accordance with claim 17, wherein a ratio of transistor width of the first control transistor to the second control transistor is n, where n determines a transimpedance value of the gain control unit.

20. A method for controlling an amplifier gain of at least one transimpedance amplifier unit, comprising:
  a) inputting an input signal to be amplified via an input terminal of the at least one transimpedance amplifier unit;
  b) amplifying the input signal and providing an output signal by the at least one transimpedance amplifier unit having an amplifier gain;
  c) outputting the amplified input signal via an output terminal, wherein the at least one transimpedance amplifier unit is arranged within a signal path defined between the input terminal and the output terminal; and
  d) controlling the gain of the at least one transimpedance amplifier unit using a gain control unit which comprises a transimpedance element configured to control a gain ratio between the output signal and the input signal by adjusting the operational current of the at least one transimpedance amplifier unit and which is arranged outside the signal path.

21. The method in accordance with claim 20, wherein the operational current of the at least one transimpedance amplifier unit is determined by a ratio of transistor emitter areas or transistor width of the at least one transimpedance amplifier unit to a ratio of transistor emitter areas or transistor width of the gain control unit.

* * * * *